United States Patent
Huang

(10) Patent No.: US 8,564,343 B2
(45) Date of Patent: Oct. 22, 2013

(54) DEVICE OF PHASE LOCKED-LOOP AND THE METHOD USING THE SAME

(75) Inventor: Hui-Min Huang, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/422,772

(22) Filed: Mar. 16, 2012

(65) Prior Publication Data

US 2012/0235719 A1    Sep. 20, 2012

(30) Foreign Application Priority Data

Mar. 18, 2011    (TW) ................................. 00109367 A

(51) Int. Cl.
  *H03L 7/06*    (2006.01)
(52) U.S. Cl.
  USPC .......................................................... 327/156
(58) Field of Classification Search
  None
  See application file for complete search history.

(56) References Cited

U.S. PATENT DOCUMENTS

| | | | |
|---|---|---|---|
| 8,081,034 B2* | 12/2011 | Anand ............................ | 331/17 |
| 8,164,369 B2* | 4/2012 | Raghunathan et al. ....... | 327/158 |
| 2008/0246546 A1* | 10/2008 | Ha et al. ........................ | 331/1 R |
| 2011/0187425 A1* | 8/2011 | Mika et al. .................... | 327/157 |
| 2011/0221489 A1* | 9/2011 | Tarng et al. ................... | 327/156 |

* cited by examiner

*Primary Examiner* — Lincoln Donovan
*Assistant Examiner* — Khareem E Almo
(74) *Attorney, Agent, or Firm* — McClure, Qualey & Rodack, LLP

(57) ABSTRACT

Nowadays, electronic product designs are aimed at saving, due to the trend to reduce energy consumption and carbon output. Ethernet technology has also been aimed specifically at saving energy; IEEE P802.3az standard (Energy Efficient Ethernet, EEE), for Ethernet released by Broadcom is one example. The disclosure turns off the phase-locked loop when the network communication stops, effectively saving the energy consumption of the network chip under the EEE standard. In the case of network reconnection, the disclosure turns on the phase-locked loop to start the network communication through adjusting the current of current source and the parameters of a low pass filter to increase the charging speed for the reference voltage generation of the low pass filter. The disclosure then shortens the start-up time to quickly output the standard output frequency and phase of the phase-locked loop.

10 Claims, 8 Drawing Sheets

DEVICE OF PHASE LOCKED-LOOP AND THE METHOD USING THE SAME

CROSS-REFERENCES TO RELATED APPLICATIONS

This non-provisional application claims priority under 35 U.S.C. §119(a) on Patent Application No. 100109367 filed in Taiwan, R.O.C. on 2011 Mar. 18, the entire contents of which are hereby incorporated by reference.

BACKGROUND

1. Technical Field

The disclosure relates to a phase-locked loop, and more particularly, to a device of phase-locked loop and the method using the same.

2. Related Art

Please refer to FIG. 1, in which phase-locked loop (PLL) is widely used in wire or wireless communication systems. Generally, PLL includes a phase frequency detector 50, a charge pump 60, a low pass filter 70, a voltage-controlled unit 80, and a divider 90. PLL uses a feedback signal to lock the output clock and phase of an output end at the reference clock and phase of an input end in a circuit loop. Consequently, the objective of PLL is to stabilize the output clock and phase, and reduce the variation thereof. PLL had been developed decades, and mostly used in a system which needs precise clock and frequency.

There are many situations in which PLL is needed to acquire a precise frequency for the system operation; for example, TV, Radio, etc products all have need of frequency modulation for wireless signal transmission, CD, PC, etc products have the need of clock control, and satellite, measuring instrument, etc products have the need of stability and precision. Otherwise, in communication field, both transmitter and receiver need a high frequency signal source from a frequency synthesizer of PLL, which the output frequency is able to be provided as a local oscillation frequency. The local oscillation frequency is used for up converting a base band signal to a radio frequency signal then to be transmitted by the transmitter. After the receiver receiving the radio frequency signal, the original signal is reversed by demodulation of the radio frequency signal.

Nowadays, electronic product designs are guided to energy saving thinking due to the energy saving and carbon reduction trend. The Ethernet technology is also guided to energy saving in detail, IEEE P802.3az standard (Energy Efficient Ethernet, EEE), for Ethernet released by Broadcom is one example of the effort. The disclosure turns off the phase-locked loop when the network communication stops for effectively saving the energy assumption of the network chip under the EEE standard.

To realize EEE standard, a network chip should save energy more effectively. PLL consumes a lot of energy in a chip, which is usually 5 mA on average. For the purpose of saving energy, turning PLL off could save a lot of energy; however, the long start-up time may cause other errors inside the network chip.

SUMMARY

A device of phase-locked loop, which includes: a phase frequency detector, a charge pump, a switch, a low pass filter, a voltage controlled oscillator, a frequency divider, and a controller. The phase frequency detector is used for receiving a reference clock and a dividing clock, and generating a control signal according to the reference clock and the dividing clock. The charge pump couples to the phase frequency detector, and has an adjustable current source, wherein the charge pump controls current output according to the control signal and regulates the adjustable current source to output a first current according to a first parameter and a second current according to a second parameter, wherein the first current is larger than the second current. The switch couples to the charge pump and a preset voltage. The low pass filter couples to the switch, used for filtering the first current or the second current to generate a reference voltage while the switch is switched to connect the low pass filter and the charge pump, and used for sustaining a voltage level to the preset voltage while the switch is switched to connect the low pass filter and the preset voltage. The voltage controlled oscillator couples to the low pass filter, and used for generating an output clock according to the reference clock. The frequency divider couples to voltage controlled oscillator and the phase frequency detector, and used for receiving the output clock to generate the dividing clock. The controller couples to the charge pump and the switch, wherein the controller controls the switch is switched to connect the preset voltage and the low pass filter under an energy saving mode, and switched to connect the charge pump and the low pass filter while leaving the energy saving mode, and directs the charge pump to output the first current according to the first parameter, then to output the second current according to the second parameter after a preset time.

A method for phase-locked loop includes the following steps: turn off a phase-locked loop when an energy saving mode is activated; adjust an adjustable current source of a charge pump to output a first current to charge an equivalent impedance for generating a reference voltage, when leaving the energy saving mode; generate an output clock according to the reference voltage; adjust the adjustable current source to output a second current to charge the equivalent impedance for generating a target frequency and phase of the output clock after a preset time, wherein the first current is greater than the second current.

In order to achieve these and other objectives, features and advantages of the disclosure comprehensible, preferred embodiments accompanied with figures are described in detail below.

BRIEF DESCRIPTION OF THE DRAWINGS

The disclosure will become more fully understood from the detailed description given herein below for illustration only, and thus not limitative of the present invention, wherein.

DETAILED DESCRIPTION

In an embodiment, the disclosure is able to save energy of internet chip, which turning off PLL when the network communication stops. In the case of network reconnection, the disclosure turns on PLL to start-up quickly to activate the entire system.

Figure 1:
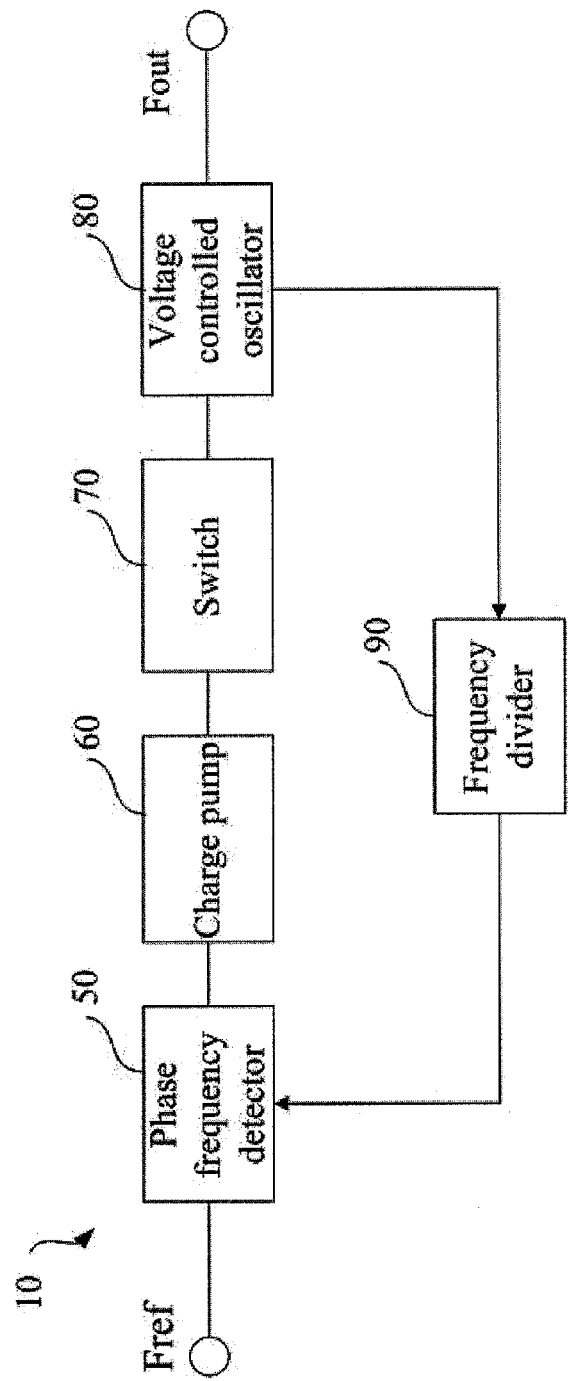
FIG. 1 is a circuit diagram of a phase-locked loop of prior art.
Figure 2:
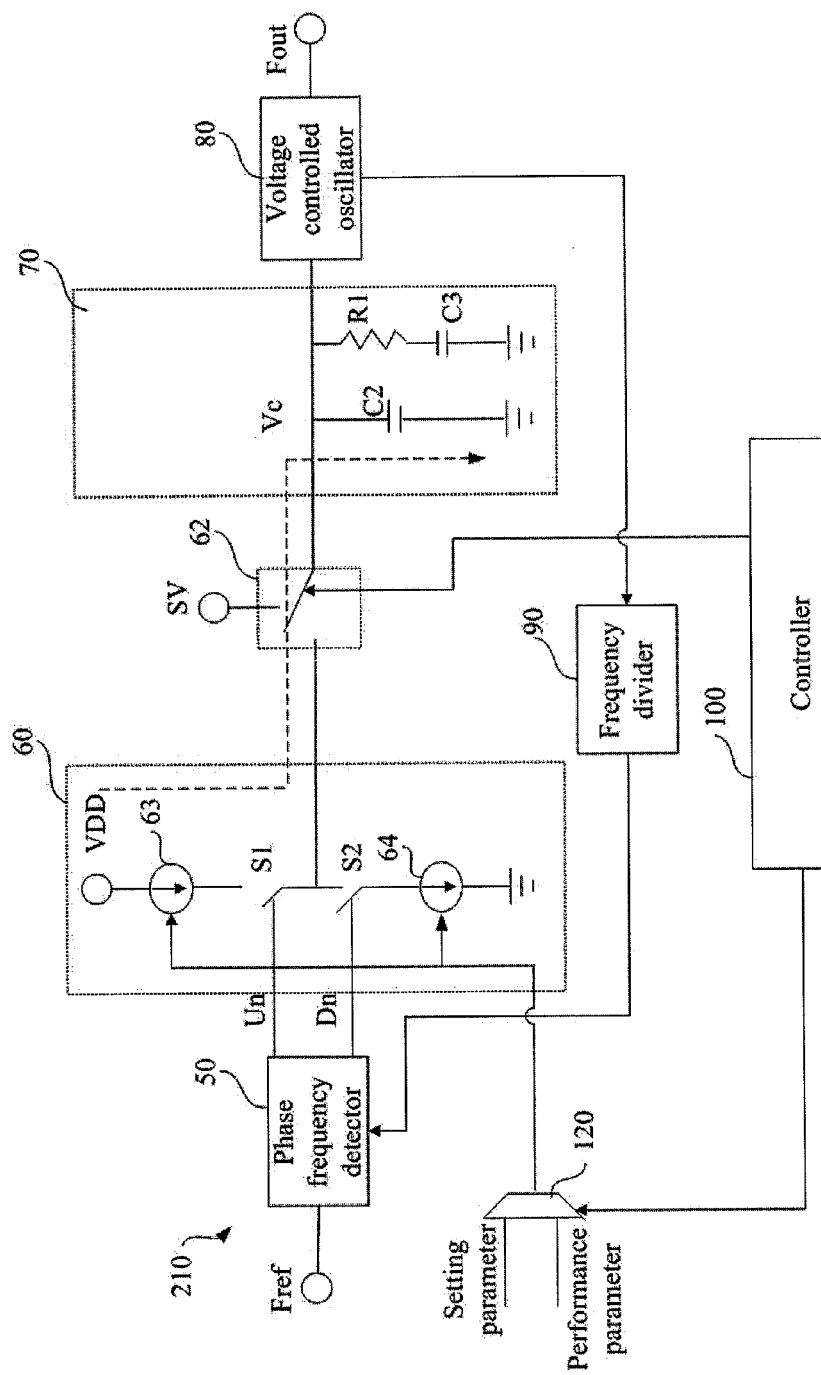
FIG. 2 is a diagram of a first embodiment of the disclosed phase-locked loop.

Please refer to FIG. 2, in which the device of phase-locked loop 210 includes a selector 120, a phase frequency detector 50, a charge pump 60, a switch 62, a low pass filter 70, a voltage controlled oscillator 80, a frequency divider 90, and a controller 100.

The phase frequency detector 50 is used for receiving a reference clock and a dividing clock to generate a control signal. The charge pump 60 couples to the phase frequency detector 50, and has an adjustable current source controlled by the selector 120. Wherein the charge pump 60 controls current output according to the control signal outputted by the selector 120 and regulates the adjustable current source to output a first current according to a first parameter (Setting parameter), and a second current according to a second parameter (Performance parameter), wherein the first current is larger than the second current. The switch 62 couples to the charge pump 60 and a preset voltage (SV). The low pass filter 70 couples to the switch 62, and used for filtering the first current or the second current to generate a reference voltage (Vc) when the switch 62 is switched to connect the low pass filter 70 and the charge pump 60. The low pass filter 70 is also used for sustaining a voltage level to the preset voltage (SV) when the switch 62 is switched to connect the low pass filter 70 and the preset voltage (SV). The voltage controlled oscillator 80 couples to the low pass filter 70, and used for generating an output clock (Fout) according to the reference voltage (Vc). The frequency divider 90 couples to the voltage controlled oscillator 80 and the phase frequency detector 50, and used for receiving the output clock (Fout) to generate the dividing clock. The controller 100 couples to the charge pump 60 and the switch 62. The controller 100 controls the switch 62 to connect the preset voltage (SV) and the low pass filter 70 under an energy saving mode, then the output of the charge pump becomes open. The controller 100 then controls the switch 62 to connect the charge pump 60 and the low pass filter 70 when leaving the energy saving mode under a wake up signal. Then the controller 100 directs the charge pump 60 to output the first current according to the first parameter to let the voltage controlled oscillator 80 shorten a start-up time of the output clock (Fout). After a preset time, the controller 100 controls the charge pump 60 output the second current according to the second parameter (Performance parameter), then the voltage controlled oscillator 80 generates a target output clock (Fout) and phase.

The phase frequency detector 50 compares a phase difference of a reference signal of reference clock (Fref), and divided clock (Fdiv). Phase Φi is a phase of the reference clock (Fref), and phase Φo is a phase of the divided clock (Fdiv) which is generated by dividing the target output clock (Fout), through the frequency divider 90. The phase difference between the reference clock (Fref), and the divided clock (Fdiv), is Φe=Φo−Φi. The phase frequency detector 50 generates a control signal according to the phase difference. The control signal has two different types, that is, first control signal (Up), and second control signal (Dn). The phase frequency detector 50 assigns the first control signal and the second control signal to be high-level voltage or low-level voltage due to the situation is phase lead or phase lag. When the phase of Fref leads the phase of Fdiv, the phase frequency detector 50 set the first control signal (Up), at high-level voltage, and set the second control signal (Dn), at high-level voltage when the phase of Fref lags the phase of Fdiv. Conversely, when the phase of Fref is equal to the phase of Fdiv, the first control signal (Up), and the second control signal (Dn), could be low-level voltage.

The charge pump 60 transforms the phase difference of the phase frequency detector 50 to reference voltage (Vc), for the voltage controlled oscillator 80. Please refer to FIG. 2, in which charge pump 60 includes two current sources 63 and 64. When the first control signal (Up), is high-level voltage and second control signal (Dn), is low-level voltage, the switch S1 is closed and the switch S2 is opened. Then the current IP of current source 63 charges the low pass filter 70 through the switch S1. When the first control signal (Up), is low-level voltage and second control signal (Dn), is high-level voltage, the switch S1 is opened and the switch S2 is closed. The current IP of current source 64 then charges the low pass filter 70 through the switch S2. When the first control signal (Up), and second control signal (Dn), both are low-level voltage, the switch S1 and the switch S2 are opened. The current source 63/64 will not charge the low pass filter 70. Under this situation, the reference clock (Fref), and the divided clock (Fdiv), are the same, meaning the reference voltage (Vc) is locked.

The charge pump 60 connects the low pass filter 70 through switch 62. Since the voltage controlled oscillator 80 is highly sensitivity to the input signal, that is, the reference voltage (Vc), the low pass filter 70 could filter the high frequency part of the reference voltage (Vc) to maintain the direct level voltage.

Please refer to FIG. 2, in which the low pass filter 70 is a second-order passive loop filter, which includes a resistor R1, and two capacitors C2 and C3. The current output from of current source 63/64 of the charge pump 60 flows into the low pass filter 70, then be transformed as the reference voltage (Vc). The paralleled capacitors C2 and C3 could filter the high frequency of the reference voltage (Vc), and the resistor R1 could generate a zero point of feedback control to improve the stability of the whole loop. Practically, capacitor C2 is greater than capacitor C3 multiply 10 times. The voltage controlled oscillator 80 is used to change a frequency of the output clock (Fout), by adjusting delay time of a delay cell inside according to the variation of the reference voltage (Vc).

Figure 3:
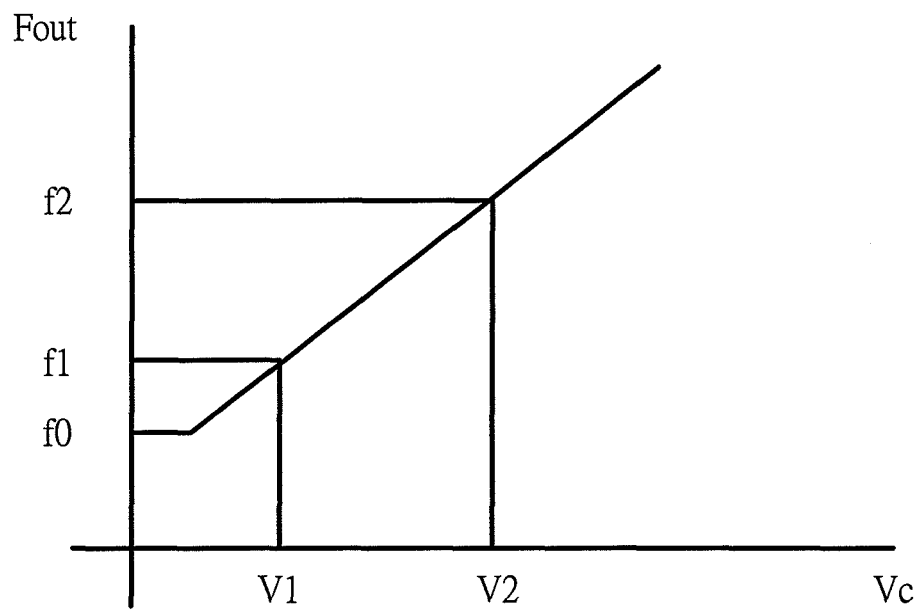
FIG. 3 is an ideal diagram of curves of voltage controlled oscillation frequency.

Please refer to FIG. 3, in which the frequency of the output clock (Fout), of the voltage controlled oscillator 80 is controlled by the inputted reference voltage (Vc), and the relationship between the frequency of the output clock (Fout), and the reference voltage (Vc) is monotonic.

The current sources 63 and 64 both include a plurality of PMOS and NMOS. The current level of the current sources 63 and 64 is adjusted by the number of PMOS and NMOS to be closed. Therefore, a number of PMOS and NMOS to be turned on at the first parameter (Setting parameter), is more than the number of PMOS and NMOS to be turned on at the second parameter (Performance parameter).

When the internet chip turns to energy saving mode, the reference voltage (Vc), is equal to the preset voltage (SV). The preset voltage (SV) could be equal to a half of VDD, for example, if VDD=1.2V, the preset voltage (SV)=0.6V. Under the energy saving mode, precharging the reference voltage (Vc) to the preset voltage (SV) has an advantage of increasing the speed for charging the reference voltage (Vc) to a higher voltage level so as to reduce the start-up time could be reduced.

When the system receives a wake up signal and leaves the energy saving mode, the controller 100 closes switch 62. At the same time, the controller 100 controls the selector 120 output the first parameter (Setting parameter), to increase the charging speed for the current sources 63/64 of the charge pump 60 charging the low pass filter 70 in a high speed manner. The reference voltage (Vc), should be raised from the preset voltage (SV), to a suitable voltage level. During this interval, the magnitude change of reference voltage (Vc), is enlarged, so the voltage controlled oscillator 80 can generate the output clock (Fout), in a shorter time.

Figure 4:
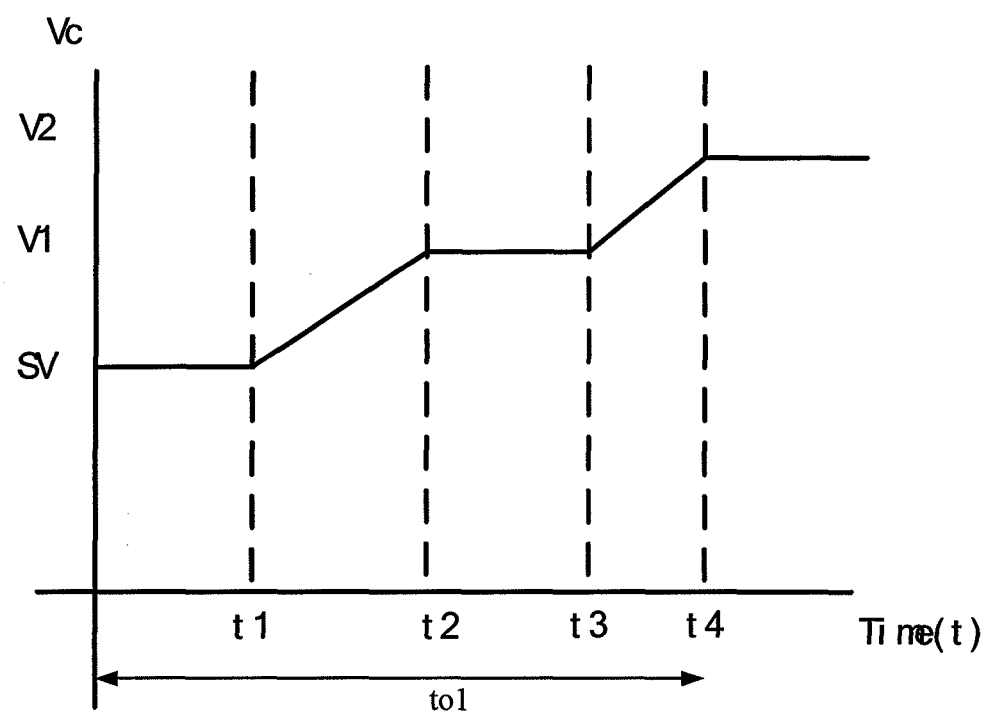
FIG. 4 is a first start-up time diagram of the first embodiment of the disclosed phase-locked loop.

Please refer to FIG. 4, in which the reference voltage (Vc), charging time (to1), from the preset voltage (SV), to Voltage level V2 is 20 u second, when the selector 120 outputs the second parameter (Performance parameter). Conversely, referring to FIG. 5, the reference voltage (Vc), charging time (to2), from the preset voltage (SV), to Voltage level V2 is 10 u second, when the selector 120 outputs the first parameter (Setting parameter). That is, using different adjustable parameters (first parameter and second parameter), could change the charging speed for the adjustable current source of the charge pump 60 charging the low pass filter 70. The first parameter (Setting parameter), derives a shortened charging time than the second parameter (Performance parameter), enabling the PLL to generate a stable output clock (Fout), in a shorter time.

After a preset time, the controller 100 directs the selector 120 to output the second parameter (Performance parameter), to adjust the adjustable current source of the charge pump 60, then the voltage controlled oscillator 80 could generate a specific frequency and phase of the output clock (Fout), according to the small magnitude change of the reference voltage (Vc).

Figure 6:
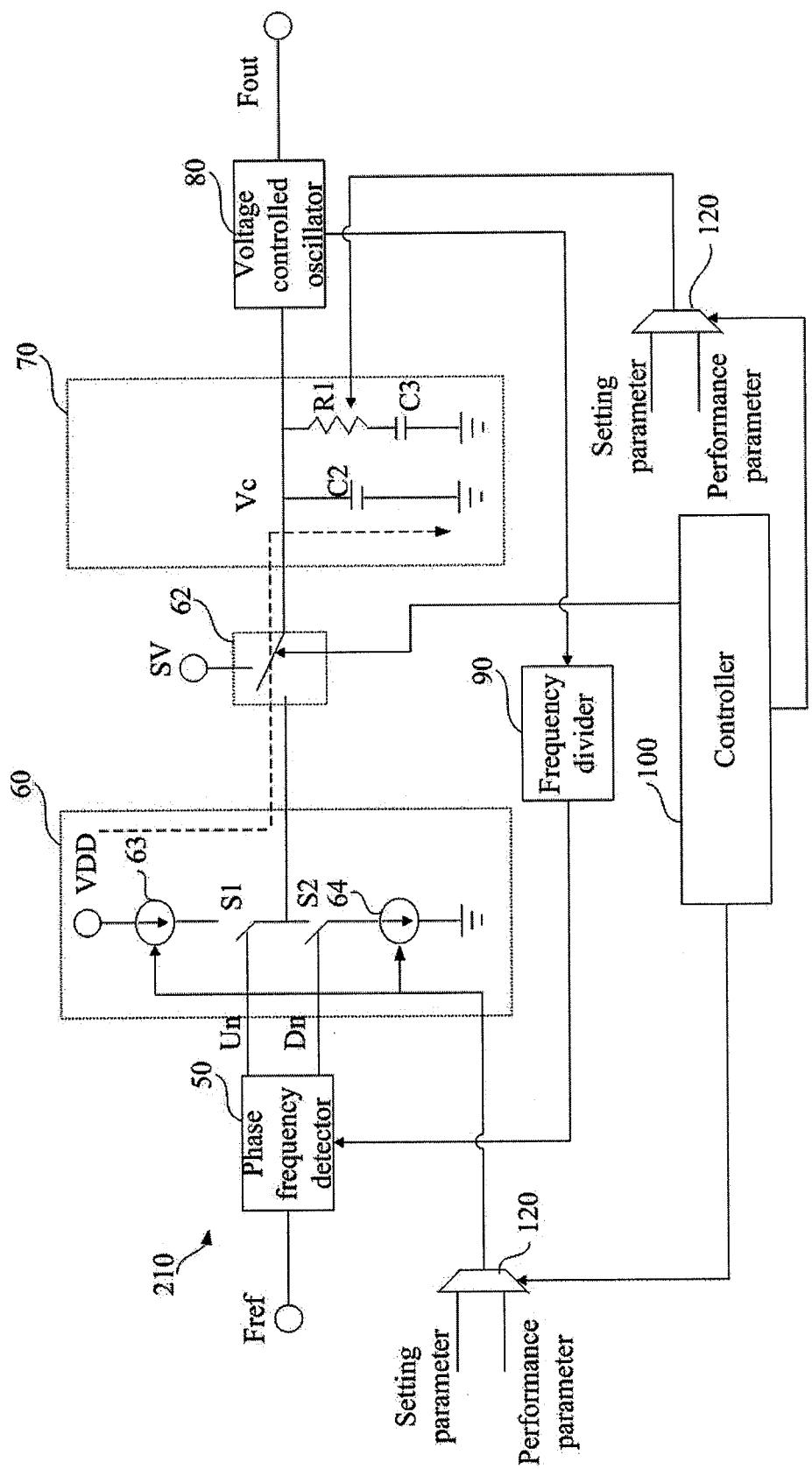
FIG. 6 is a diagram of a second embodiment of the disclosed phase-locked loop.

Please refer to FIG. 6 and FIG. 2, in which the second embodiment adds a control mechanism for adjusting a variable resistor of the low pass filter 70. The controller 100 controls the switch 62 to be closed. At the same time, the controller 100 controls the selector 120 to output the first parameter (Setting parameter), for the charge pump 60, and output a third parameter (Setting parameter), for the low pass filter 70. The low pass filter 70 increases equivalent impedance (the connection in series and parallel among the resistor R1, the capacitor C2, and the capacitor C3), through adjusting the resistance of the resistor R1 (in this case, the resistor R1 is a variable resistor), according to the third parameter (Setting parameter), then the current source 63/64 of the charge pump 60 could charge the equivalent impedance in a high speed to guide the magnitude change of the reference voltage (Vc). The voltage controlled oscillator 80 can start-up the output clock (Fout) in a shorter time due to the larger magnitude change of the reference voltage (Vc). It is noticed that adjusting the resistance is one embodiment of present invention, not a limitation. Other structures or approaches with the same function, for example: adjusting the capacitor of the filter, as mentioned are also belonging to the scope of the invention.

Figure 5:
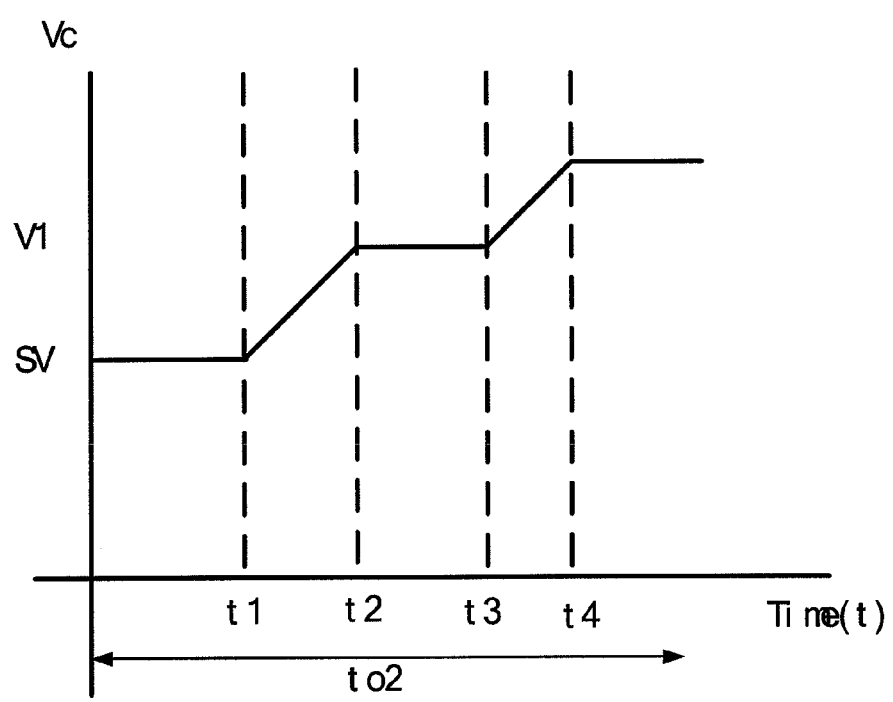
FIG. 5 is a second start-up time diagram of the first embodiment of the disclosed phase-locked loop.
Figure 7:
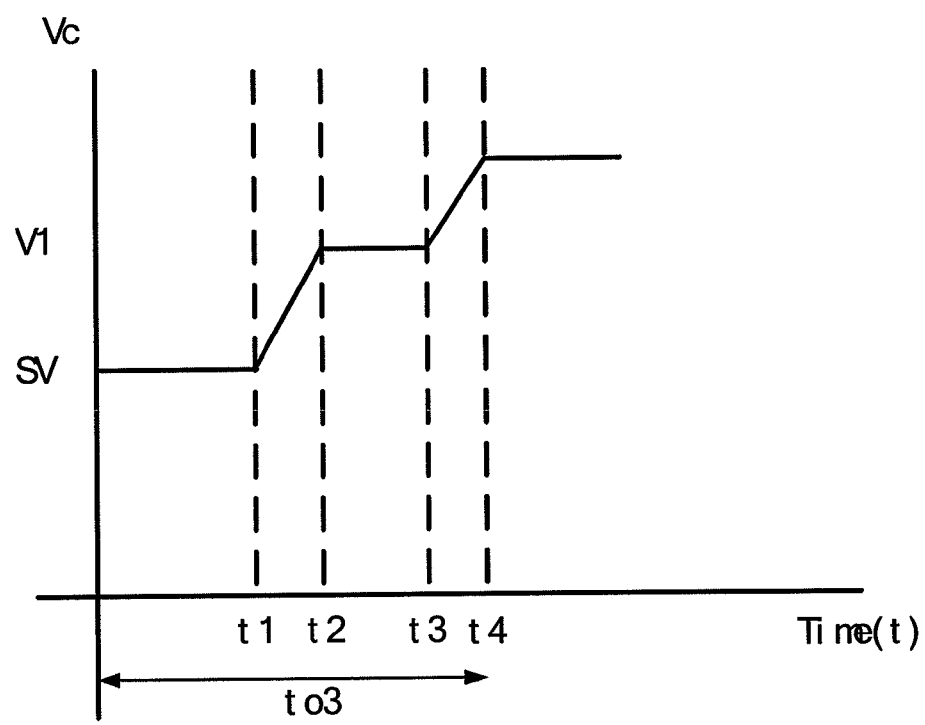
FIG. 7 is a start-up time diagram of the second embodiment of the disclosed phase-locked loop.

Please refer to FIG. 7, FIG. 4, and FIG. 5, in which the reference voltage (Vc), charging time (to1), from the preset voltage (SV), to Voltage level V2 is 20 u second, when the selector 120 outputs the second parameter (Performance parameter). Conversely, referring to FIG. 5, the reference voltage (Vc), charging time (to2), from the preset voltage (SV), to Voltage level V2 is 10 u second, when the selector 120 outputs the first parameter (Setting parameter). However, referring to FIG. 7, the reference voltage (Vc), charging time (to3), from the preset voltage (SV), to Voltage level V2 is 5 u second. That is to say, through adjusting the current source 63/64 of the charge pump 60 by the first parameter (Setting parameter), and the variable parameters of the low pass filter 70 by the third parameter (Setting parameter), the charging time could obviously be reduced.

In other words, using different adjustable parameters (first parameter and second parameter), could change the charging speed for the adjustable current source of the charge pump 60 charging the low pass filter 70. The first parameter (Setting parameter), derives a shorter charging time than the second parameter (Performance parameter), and enables the PLL to generate a stable output clock (Fout), in a shorter time.

After a preset time, the controller 100 directs the selector 120 to output the second parameter (Performance parameter), to adjust the adjustable current source of the charge pump 60, and output the fourth parameter (Performance parameter), to adjust the variable parameters of the low pass filter 70. The voltage controlled oscillator 80 can then generate a specific frequency and phase of the output clock (Fout), according to the small magnitude change of the reference voltage (Vc).

Figure 8:
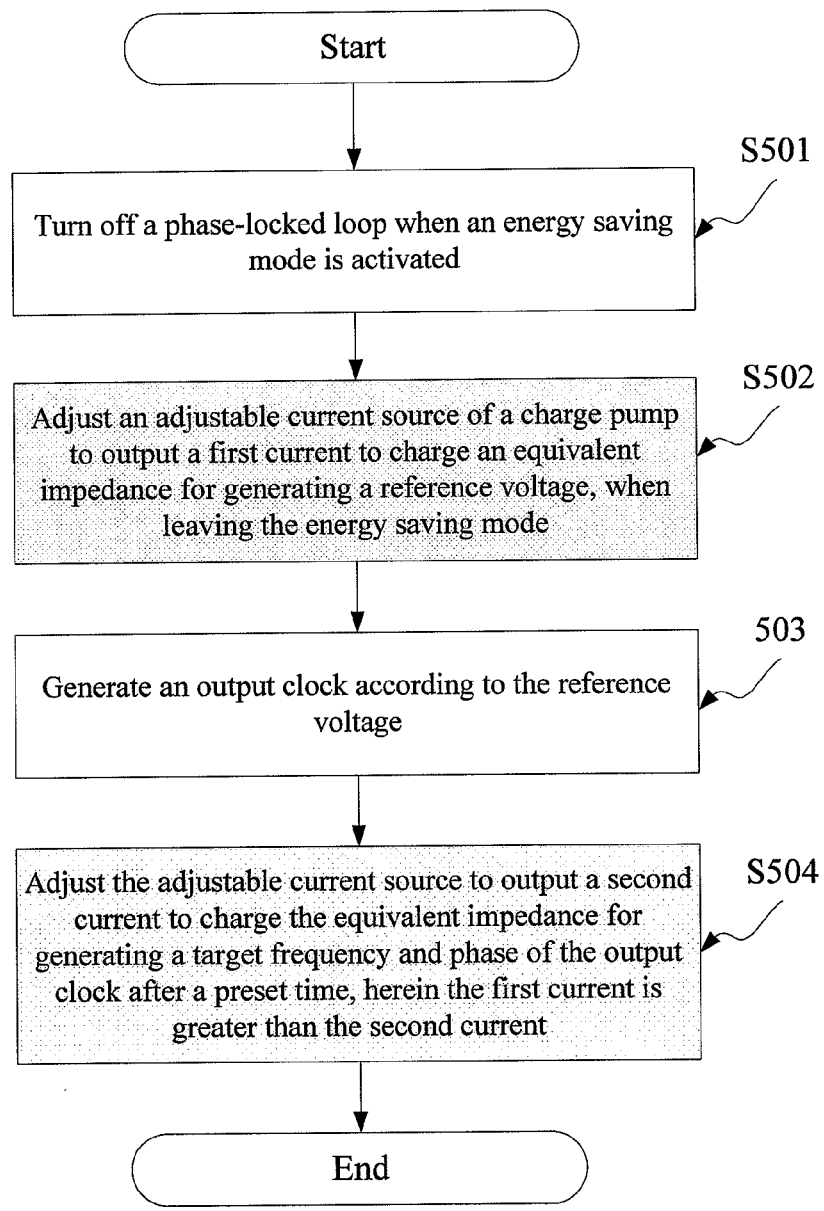
FIG. 8 is a first flow chart of disclosed phase-locked loop.

Referring now to FIG. 8, the first flow chart of disclosed phase-locked loop includes the following steps:

In Step S501, turn off a phase-locked loop when an energy saving mode is activated.

In Step S502, adjust an adjustable current source of a charge pump to output a first current to charge an equivalent impedance for generating a reference voltage, when leaving the energy saving mode.

In Step S503, generate an output clock according to the reference voltage.

In Step S504, adjust the adjustable current source to output a second current to charge the equivalent impedance for generating a target frequency and phase of the output clock after a preset time, wherein the first current is greater than the second current.

Figure 9:
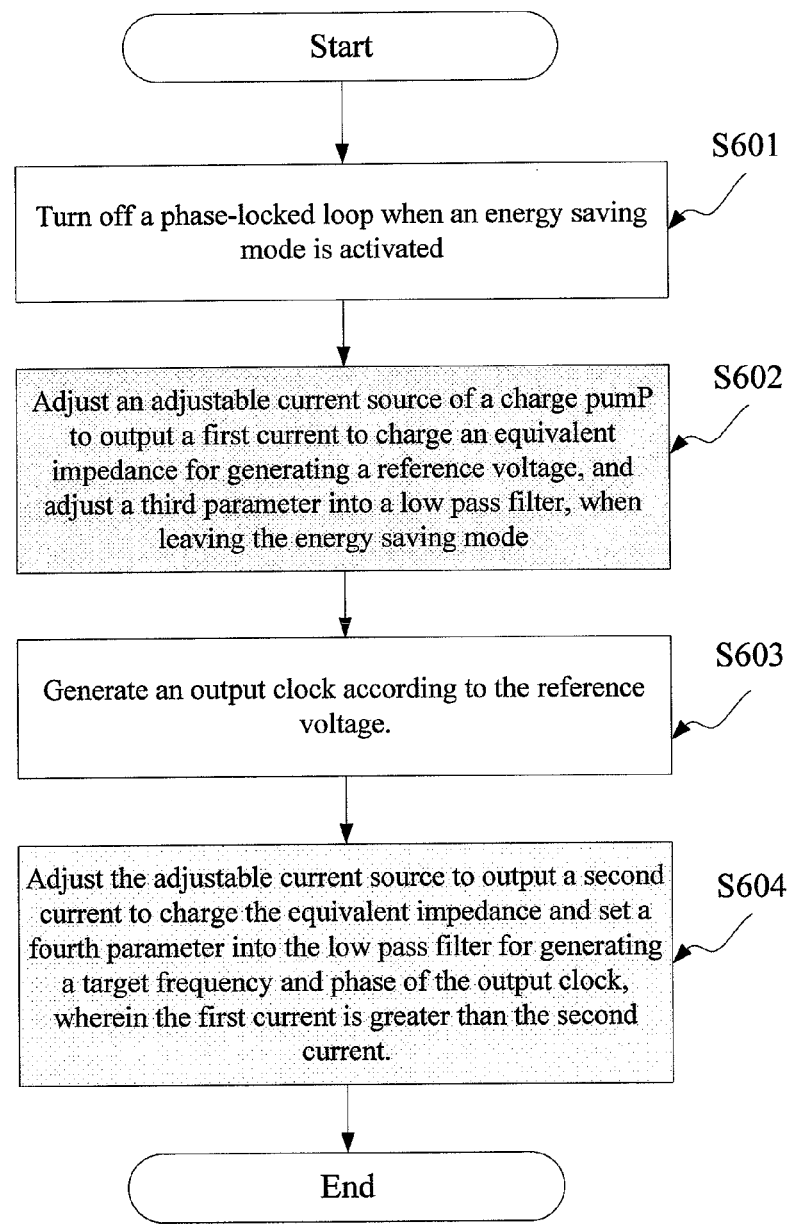
FIG. 9 is a second flow chart of disclosed phase-locked loop.

Referring now to FIG. 9, the second flow chart of disclosed phase-locked loop includes the following steps:

In Step S601, turn off a phase-locked loop when an energy saving mode is activated.

In Step S602, adjust an adjustable current source of a charge pump to output a first current to charge an equivalent impedance for generating a reference voltage, and set a third parameter into a low pass filter, when leaving the energy saving mode.

In Step S603, generate an output clock according to the reference voltage.

In Step S604, adjust the adjustable current source to output a second current to charge the equivalent impedance and set a fourth parameter into the low pass filter for generating a target frequency and phase of the output clock, wherein the first current is greater than the second current. Performance parameter When the third parameter (Setting parameter) is set, the magnitude change of the reference voltage output of the low pass filter is increased. On the contrary, when the fourth parameter (Performance parameter) is set, the magnitude change of the reference voltage output of the low pass filter is reduced. In one embodiment, The resistance of an adjustable resistor of the low pass filter under the setting of third parameter (Setting parameter) is greater than the resistance of the adjustable resistor of the low pass filter under the setting of fourth parameter (Performance parameter).

Additionally, the preset time is usually within 5 u second. This invention provide an approach to reduce the Setting time and increase the stability of PLL by properly adjusting the current source of charge pump and the impedance of the low pass filter. It is noticed that the current source and the impedance adjustment description above is not a limitation for the disclosure, selecting parameters would be established under different design plans.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A device of phase-locked loop, comprising:
   a phase frequency detector, receiving a reference clock and a dividing clock, and generating a control signal according to the reference clock and the dividing clock;
   a charge pump, coupled to the phase frequency detector, having an adjustable current source, wherein the charge pump controls current output according to the control signal and regulates the adjustable current source to output a first current according to a first parameter and a second current according to a second parameter, wherein the first current is larger than the second current;
   a switch, coupled to the charge pump and a preset voltage;
   a low pass filter, coupled to the switch, for filtering the first current or the second current to generate a reference voltage while the switch is connecting the low pass filter and the charge pump, and sustaining a voltage level to the preset voltage while the switch is connecting the low pass filter and the preset voltage;
   a voltage controlled oscillator, coupled to the low pass filter, for generating an output clock according to a reference voltage;
   a frequency divider, coupled to the voltage controlled oscillator and the phase frequency detector, for receiving the output clock to generate the dividing clock;
   a controller, coupled to the charge pump and the switch, for controlling the switch to connect the preset voltage and the low pass filter under an energy saving mode, controlling the switch to connect the charge pump and low pass filter while leaving the energy saving mode, directing the charge pump to output the first current according to the first parameter, and directing the charge pump to output the second current according to the second parameter after a preset time; and
   a selector configured to output the first and second parameters to the charge pump based on leaving the energy saving mode.

2. The device of phase-locked loop according to claim 1, wherein the controller couples to the low pass filter, and adjusts the low pass filter according to a resistive adjustment parameter, the low pass filter increases a magnitude change of the reference voltage and the voltage controlled oscillator decreases a startup time of the output clock when the resistive adjustment parameter equals to a third parameter, the low pass filter decreases the magnitude change of the reference voltage when the resistive adjustment parameter equals to a fourth parameter.

3. The device of phase-locked loop according to claim 2, wherein the controller adjusts the resistive adjustment parameter as the third parameter while controlling the charge pump outputting the first current, and adjusts the resistive adjustment parameter as the fourth parameter while controlling the charge pump outputting the second current.

4. The device of phase-locked loop according to claim 2, wherein the low pass filter comprises:
   a second capacitor, coupled to the switch;
   a variable resistor, coupled to the switch, a resistance of the variable resistor is a fourth resistance when the resistive adjustment parameter is the fourth parameter, the resistance of the variable resistor is a third resistance when the resistive adjustment parameter is the third parameter, the fourth resistance is lower than the third resistance; and
   a third capacitor, coupled to the variable resistor;
   wherein the variable resistor is connected in series with the third capacitor, and connected in parallel with the second capacitor to filter a high frequency noise.

5. The device of phase-locked loop according to claim 3, wherein the preset time is under 5 u second.

6. The device of phase-locked loop according to claim 3, wherein the charge pump is a current mirror, which comprises a plurality of transistor switches.

7. A method for phase-locked loop, comprises:
   turning off a phase-locked loop when an energy saving mode is activated;
   adjusting an adjustable current source of a charge pump to output a first current to charge an equivalent impedance for generating a reference voltage, when leaving the energy saving mode;
   generating an output clock according to the reference voltage; and
   adjusting the adjustable current source to output a second current to charge the equivalent impedance for generating a target frequency and phase of the output clock after a preset time.

8. The method of phase-locked loop according to claim 7, further comprises:
   adjusting a low pass filter according to a third parameter to increase a magnitude change of the reference voltage of the low pass filter, when the adjustable current source is adjusted to output the first current.

9. The method of phase-locked loop according to claim 7, further comprises
   adjusting the low pass filter according a fourth parameter to decrease a magnitude change of the reference voltage of the low pass filter.

10. The method of phase-locked loop according to claim 7, wherein a resistance of an adjustable resistor of the low pass filter due to the third parameter is greater than the resistance of the adjustable resistor of the low pass filter due to the fourth parameter.

* * * * *